(12) United States Patent
Lin et al.

(10) Patent No.: US 6,844,143 B2
(45) Date of Patent: Jan. 18, 2005

(54) SANDWICH PHOTORESIST STRUCTURE IN PHOTOLITHOGRAPHIC PROCESS

(75) Inventors: Benjamin Szu-Min Lin, Hsinchu (TW); Vencent Chang, Taipei (TW); George Liu, Taoyuan Hsien (TW); Cheng-Chung Chen, Taoyuan Hsien (TW)

(73) Assignee: United Microelectronics Corp., Hsinchu (TW)

( * ) Notice: Subject to any disclaimer, the term of this patent is extended or adjusted under 35 U.S.C. 154(b) by 131 days.

(21) Appl. No.: 10/064,649

(22) Filed: Aug. 2, 2002

(65) Prior Publication Data

US 2004/0009434 A1 Jan. 15, 2004

(30) Foreign Application Priority Data

Jul. 11, 2002 (TW) ............................................. 91115384

(51) Int. Cl.[7] ................................................. G03F 7/20
(52) U.S. Cl. ........................ 430/317; 430/312; 430/394; 430/950

(58) Field of Search .................................. 430/311, 313, 430/314, 317, 394, 950, 312

(56) References Cited

U.S. PATENT DOCUMENTS 5,882,996 A * 3/1999 Dai ............................. 438/597
6,004,722 A * 12/1999 Zhang et al. ............. 430/271.1

* cited by examiner

*Primary Examiner*—Kathleen Duda
(74) *Attorney, Agent, or Firm*—J.C. Patents

(57) ABSTRACT

A photolithographic process that involves building a sandwich photoresist structure. A first photoresist layer is formed over a substrate. An anti-reflection layer is formed over the first photoresist layer. A second photoresist layer is formed over the anti-reflection layer. A first photo-exposure is conducted and the exposed second photoresist layer is developed to pattern the second photoresist layer and the anti-reflection layer. Using the second photoresist layer and the anti-reflection layer as a mask, a second photo-exposure and a second photoresist development are conducted to pattern the first photoresist layer.

7 Claims, 5 Drawing Sheets

SANDWICH PHOTORESIST STRUCTURE IN PHOTOLITHOGRAPHIC PROCESS

CROSS REFERENCE TO RELATED APPLICATIONS

This application claims the priority benefit of Taiwan application serial no. 91115384, filed Jul. 11, 2002.

BACKGROUND OF INVENTION

The present invention relates to a photolithographic process. More particularly, the present invention relates to a photolithographic process that employs a sandwich photoresist structure.

As the level of integration of integrated circuits increases, dimensions of devices within the integrated circuits must be reduced. Photolithographic processes are important in the manufacturing of metal-oxide-semiconductor (MOS) related devices. For example, the patterning of thin film layers and the formation of doped regions involve photolithographic processes. However, many problems are encountered as device dimensions are reduced. The miniaturization of devices is often limited by current resolution of the photolithographic process. Furthermore, the reduction of device dimensions also increases the probability of having alignment errors. To match up with the required miniaturization, methods for increasing the resolution of photomask and processes having self-aligning capacity have been developed.

Conventional methods for increasing resolution include such techniques as phase shift mask (PSM) photolithography and optical proximity correction (OPC). However, all these methods target an improvement in the design of photomask and rarely aim at the design of photoresist structure.

In general, misalignment is highly probable when a device is miniaturized. A dual damascene structure is particularly vulnerably to a misalignment problem due to the separate formation of a trench and a via opening using two masks. At present, a number of self-aligned processes have already been developed, but none of them suggests a self-aligned method that uses a sandwich photoresist structure to form a dual damascene structure.

SUMMARY OF INVENTION

Accordingly, one object of the present invention is to provide a method of increasing the resolution of a photolithographic process through the formation of a specially designed sandwich photoresist structure.

A second object of this invention is to provide a method of forming a self-aligned dual damascene structure through the formation of a specially designed sandwich photoresist structure.

To achieve these and other advantages and in accordance with the purpose of the invention, as embodied and broadly described herein, the invention provides a method of increasing the resolution of a photolithographic process through the formation of a specially designed sandwich photoresist structure. A substrate having a material layer thereon is provided. A first photoresist layer is formed over the material layer. The first photoresist layer can be a positive photoresist layer and has a sufficient thickness for resisting the etchant deployed in a subsequent etching operation. An anti-reflection layer is formed over the first photoresist layer. The anti-reflection layer is formed from a material that can be dissolved by a chemical developer. Thereafter, a second photoresist layer is formed over the anti-reflection layer. The second photoresist layer can be a positive photoresist layer or a negative photoresist layer and thickness of the second photoresist layer is sufficiently thin to increase the resolution of a photolithographic process. A first photo-exposure of the second photoresist layer is carried out immediately followed by a first chemical development of the second photoresist layer to pattern the second photoresist layer and the anti-reflection layer. Using the second photoresist layer and the anti-reflection layer as a mask, a second photo-exposure is carried out immediately followed by a second photoresist development to pattern the first photoresist layer. Finally, the material layer is patterned using the patterned first photoresist layer, the second photoresist layer and the anti-reflection layer as an etching mask.

This invention also provides a method of forming the opening of a self-aligned dual damascene structure. A substrate having a dielectric layer thereon is provided. A first photoresist layer, an anti-reflection layer and a second photoresist layer are sequentially formed over the dielectric layer. The first photoresist layer can be a positive photoresist layer and the second photoresist layer can be a negative photoresist layer. The anti-reflection layer is formed from a material that can be dissolved by a chemical developer. A first photo-exposure of the second photoresist layer is carried out immediately followed by a first chemical development of the exposed second photoresist layer so that the second photoresist layer and the anti-reflection layer are patterned to form a trench. A second photo-exposure of the first photoresist layer is carried out immediately followed by a second chemical development so that the first photoresist layer is patterned into a via opening underneath the trench. The trench and the via opening together form a dual damascene opening pattern. Finally, an etching operation is conducted to transfer the dual damascene opening pattern to the dielectric layer, thereby forming a dual damascene opening in the dielectric layer.

The method of using a sandwich photoresist structure in photolithographic process is able to increase the ultimate resolution of a photolithographic process because the second photoresist layer is sufficiently thin. The patterned first photoresist layer under the second photoresist layer is the actual etching mask layer in a subsequent etching operation.

The method of forming a self-aligned dual damascene opening according to this invention utilizes the second photoresist layer and the anti-reflection layer to form the trench. Thereafter, the masking effect of the second photoresist layer permits the formation of a self-aligned via opening underneath the trench.

It is to be understood that both the foregoing general description and the following detailed description are exemplary, and are intended to provide further explanation of the invention as claimed.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION

Figure 1A:
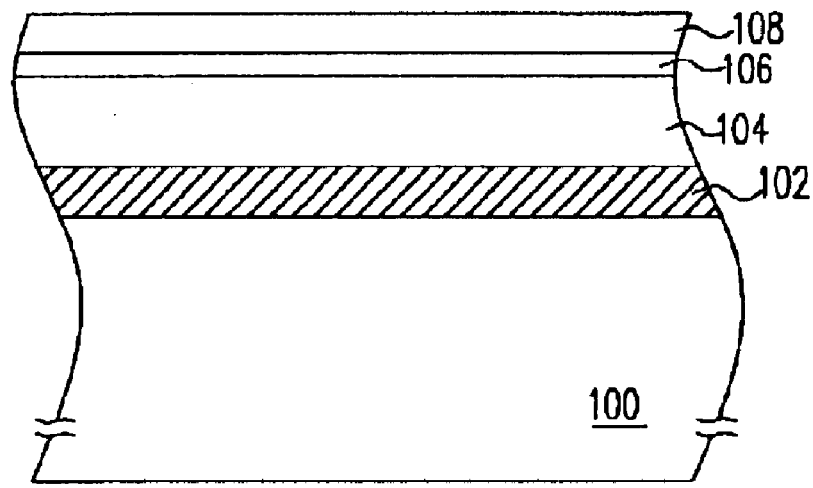
FIGS. 1A to 1D are schematic cross-sectional views showing the progression of steps carried out to increase the resolution of a photolithographic process according to a first embodiment of this invention.

Reference will now be made in detail to the present preferred embodiments of the invention, examples of which are illustrated in the accompanying drawings. Wherever possible, the same reference numbers are used in the drawings and the description to refer to the same or like parts.

FIGS. 1A to 1D are schematic cross-sectional views showing the progression of steps carried out to increase the resolution of a photolithographic process according to a first embodiment of this invention. As shown in FIG. 1A, a substrate 100 having a material layer 102 thereon is provided. A first photoresist layer 104 is formed over the material layer 102. The first photoresist layer 104 can be a positive photoresist layer and has a sufficient thickness to resist etchant in a subsequent etching operation. In this embodiment, the first photoresist layer 104 has a thickness between about 2000 Å to 7000 Å.

An anti-reflection layer 106 is formed over the first photoresist layer 104. The anti-reflection layer 106 has a thickness between about 300 Å to 1000 Å. The anti-reflection layer 106 is formed from a material that can be dissolved in a chemical developer. In this embodiment, the anti-reflection layer 106 includes addition polymerization polymer, such as polyacrylic acid, condensation polymerization polymer, such as polyester, or ring-opening polymerization polymer, such as polycarbonate. However, other non-photosensitive material that can be dissolved by a chemical developer may also be used to form the anti-reflection layer 106.

A second photoresist layer 108 is formed over the anti-reflection layer 106. The second photoresist layer 108 can be a positive photoresist layer or a negative photoresist layer. The second photoresist layer 108 must be sufficiently thin to increase the resolution of the photolithographic process. In this embodiment, the second photoresist layer 108 has a thickness between about 1000 Å to 3000 Å.

Figure 1B:
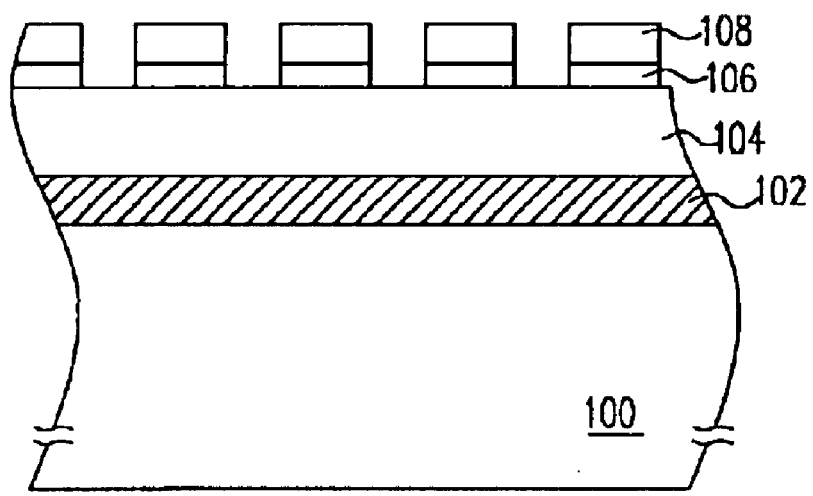

As shown in FIG. 1B, a first photo-exposure of the second photoresist layer 108 is carried out. This is followed by a first chemical development of the second photoresist layer so that the second photoresist layer 108 and the anti-reflection layer 106 are patterned together. Since a material that can be dissolved in a chemical developer is selected to form the anti-reflection layer 106, both the second photoresist layer 108 and the anti-reflection layer 106 can be patterned in the first chemical development. Furthermore, because the second photoresist layer 108 has a thickness between about 1000 Å to 3000 Å in this embodiment, resolution of exposure and photoresist development is greatly increased.

Figure 1C:
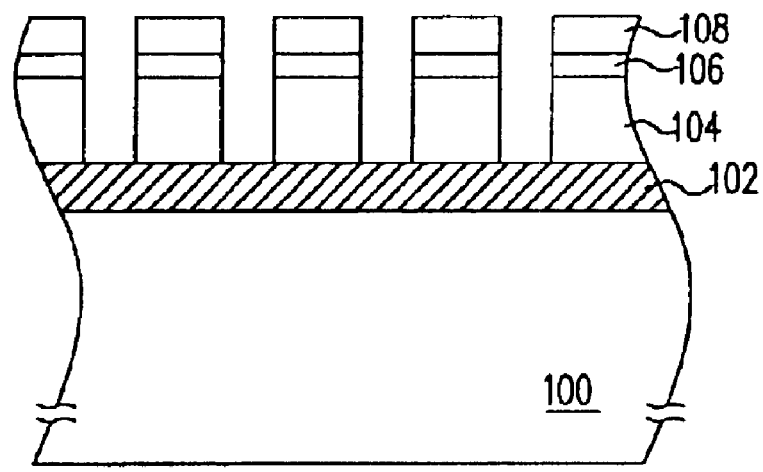
Figure 1D:
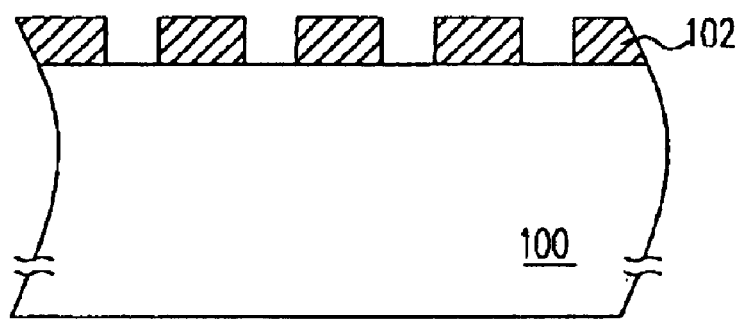

As shown in FIGS. 1C and 1D, using the second photoresist layer 108 and the anti-reflection layer 106 as a mask, a second photo-exposure of the first photoresist layer 104 is carried out. This is immediately followed by a second chemical development of the first photoresist layer 104. Thereafter, using the patterned second photoresist layer 108, the anti-reflection layer 106 and the first photoresist layer 104 as an etching mask, an etching operation is conducted to pattern the material layer 102.

Note that although the second photoresist layer 108 or even the anti-reflection layer 106 is removed in the second chemical development, the first photoresist layer 104 has a sufficient thickness to resist the etchant in a subsequent etching operation. Hence, the material layer 102 is properly patterned.

In this embodiment, a sandwich structure comprising the first photoresist layer 104, the anti-reflection layer 106 and the second photoresist layer 108 is used to increase overall resolution. In fact, the thin second photoresist layer 108 is the principle means of countering the limitations of a conventional photolithographic process. The anti-reflection layer 106 serves as an absorber in photoresist exposure while the first photoresist layer 104 serves as an etching mask in an etching operation.

Figure 2A:
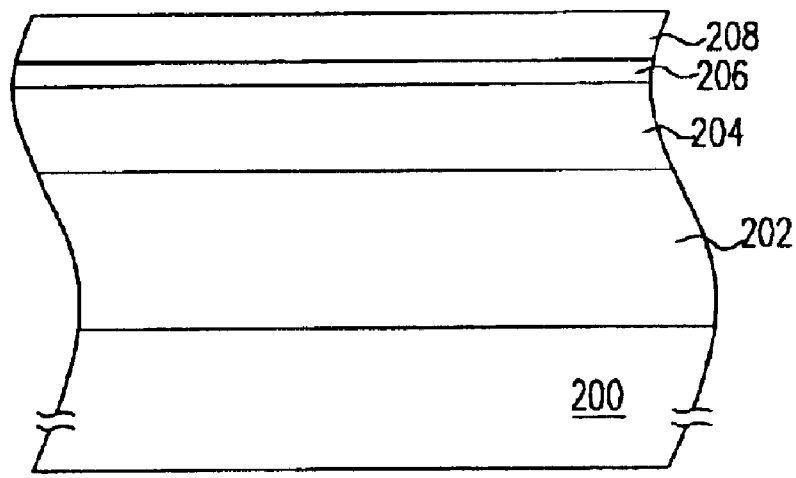
FIGS. 2A to 2E are schematic cross-sectional views showing the progression of steps carried out to form a self-aligned dual damascene structure according to a second embodiment of this invention.

FIGS. 2A to 2E are schematic cross-sectional views showing the progression of steps carried out to form a self-aligned dual damascene structure according to a second embodiment of this invention. As shown in FIG. 2A, a substrate 200 having a dielectric layer 202 thereon is provided. A first photoresist layer 204 is formed over the dielectric layer 202. The first photoresist layer 204 is a positive photoresist layer having a thickness between about 2000 Å to 4000 Å, for example.

An anti-reflection layer 206 having a thickness between about 300 Å to 1000 Å is formed over the first photoresist layer 204. The anti-reflection layer 206 is formed from a material that can be dissolved in a chemical developer. In the embodiment, the anti-reflection layer 206 includes addition polymerization polymer, such as polyacrylic acid, condensation polymerization polymer, such as polyester, or ring-opening polymerization polymer, such as polycarbonate. Other non-photosensitive material may also be used to form the anti-reflection layer 206. The non-photosensitive material is also preferably dissolvable in a chemical developer.

A second photoresist layer 208 is formed over the anti-reflection layer 206. The second photoresist layer 208 having a thickness between about 2000 Å to 4000 Å is a negative photoresist layer, for example.

Figure 2B:
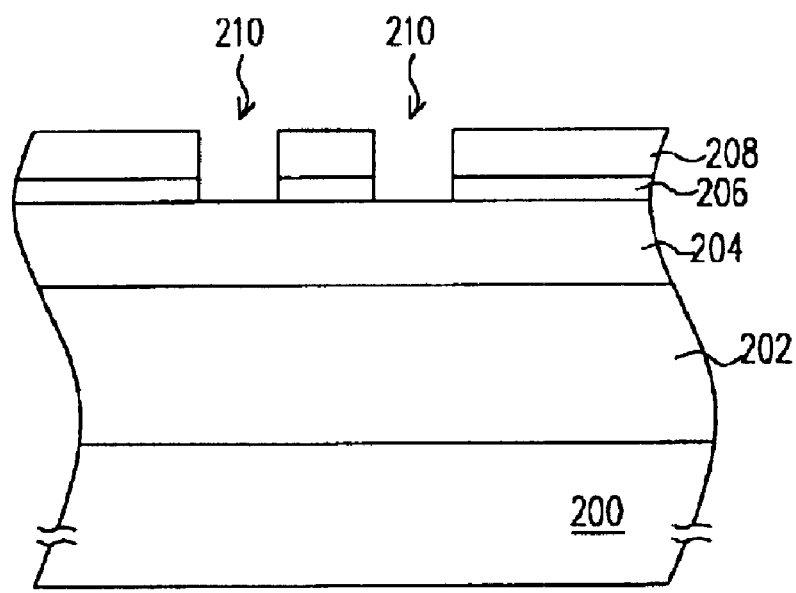

As shown in FIG. 2B, a first photo-exposure of the second photoresist layer 208 is carried out. This is followed by a first chemical development of the second photoresist layer 208. Hence, the second photoresist layer 208 and the anti-reflection layer 206 are patterned to form a trench 210. Since the anti-reflection layer 206 can be dissolved in the chemical developer, the first chemical development is able to pattern both the second photoresist layer 208 and the anti-reflection layer 206 at the same time.

Figure 2C:
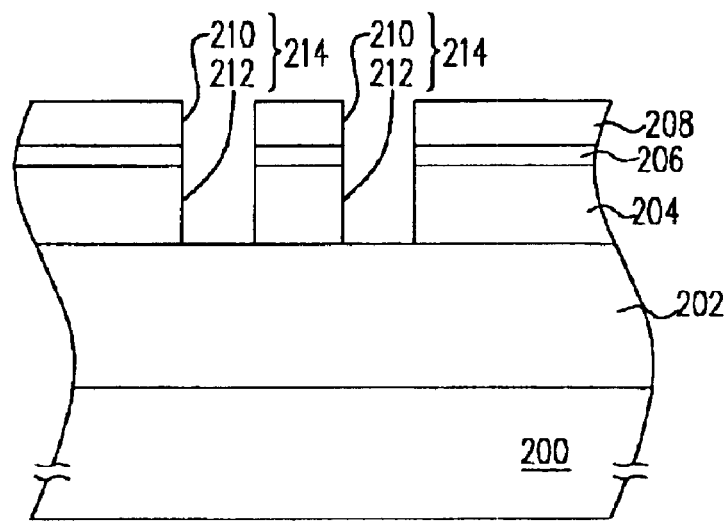

As shown in FIG. 2C, a second photo-exposure of the first photoresist layer 204 is carried out. This is followed by a second chemical development of the first photoresist layer 204 to form a via opening 212 underneath the trench 210. The trench 210 and the via opening 212 together form a dual damascene opening 214.

Since the second photoresist 208 is a negative photoresist layer, the photoresist has already formed cross-links in the first photo-exposure. Hence, the second photo-exposure has little effect on the second photoresist layer 208. Furthermore, in the second photo-exposure for forming the via opening 212, the exposed area within the photomask for patterning the via opening 212 may be enlarged due to overhead coverage by the second photoresist layer 208. Consequently, the area for forming the via opening 212 may be fully exposed. Thus, the via opening 212 is formed in a self-aligned manner underneath the trench 210. In addition, two neighboring via openings 212 may be fabricated together under the same patch of exposed area so that the via openings 212 are formed underneath the pattern 210 after the second chemical development.

Figure 2D:
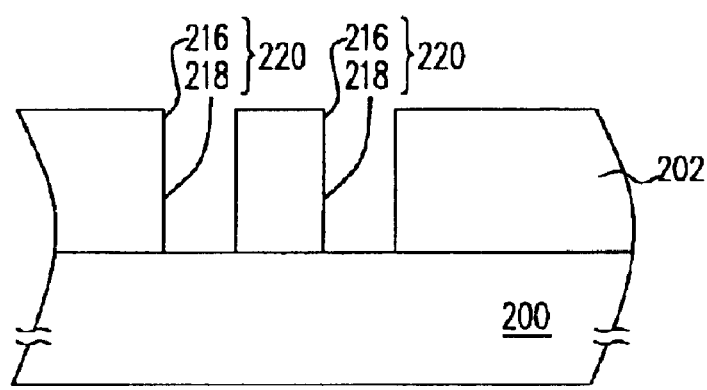

As shown in FIG. 2D, using the patterned second photoresist layer 208, the anti-reflection layer 206 and the first photoresist layer 204 as an etching mask, an etching operation is conducted. Ultimately, the dual damascene opening pattern 214 is transferred to the dielectric layer 202 to form a dual damascene opening 220. The dual damascene opening 220 actually comprises of a trench 216 and a via opening 218.

Figure 2E:
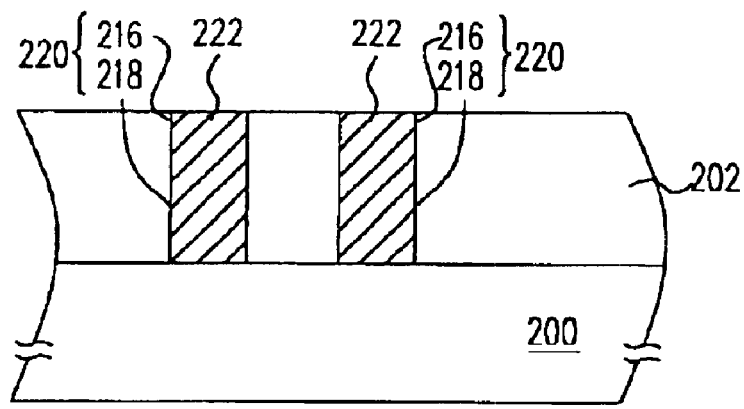
Figure 3:
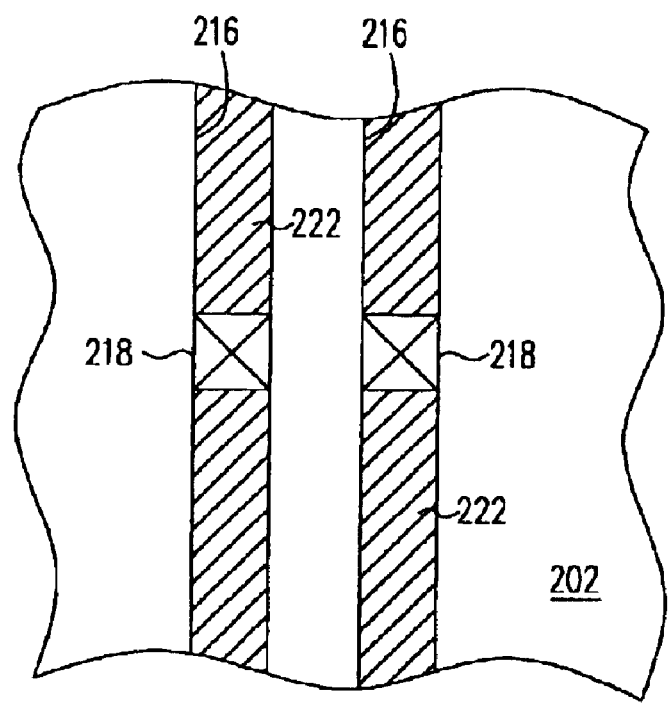
FIG. 3 is a top view of the structure shown in FIG. 2E.

As shown in FIG. 2E, a metallic layer 222 is deposited into the dual damascene opening 220 to form a dual damascene structure. The metallic layer 222 is formed, for example, by depositing metallic material over the dielectric layer 202 to fill the dual damascene opening 220 and conducting a chemical-mechanical polishing or etching to planarize and expose the dielectric layer 202. A top view of the dual damascene structure is shown in FIG. 3. In FIG. 3, the via opening 218 aligns with the trench 216 automatically.

In conclusion, major advantages of this invention include:
1. The first photoresist layer in the sandwich structure is sufficiently thin to increase the resolution of a photolithographic process and the patterned second photoresist layer underneath the first photoresist layer is the real etching mask for the etching operation. 2. In the method of forming self-aligned dual damascene opening, the second photoresist layer and the anti-reflection layer are used to form a trench pattern. The patterned second photoresist layer is next employed to form the via opening pattern that self-aligns with the trench pattern.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of forming the self-aligned dual damascene opening of a dual damascene structure, comprising the steps of:

providing a substrate having a dielectric layer thereon;

forming a first photoresist layer over the dielectric layer;

forming a non-photosensitive material layer over the first photoresist layer, wherein the non-photosensitive material layer includes an anti-reflection layer and a material of the anti-reflection layer is selected from the group consisting of addition polymerization polymer, condensation polymerization polymer and ring-opening polymerization polymer;

forming a second photoresist layer over the non-photosensitive material layer;

conducting a first photo-exposure of the second photoresist layer;

conducting a first photoresist development to pattern the second photoresist layer and the non-photosensitive material layer and form a trench;

conducting a second photo-exposure of the first photoresist layer;

conducting a second photoresist development to pattern the first photoresist layer and form a via opening underneath the trench, wherein the trench and the via opening together constitute a dual damascene opening pattern; and conducting single etching operation to transfer the dual damascene opening pattern to the dielectric layer using the patterned first photoresist layer, the patterned non-photosensitive layer and the patterned second photoresist layer as an etching mask, thereby forming a dual damascene opening in the dielectric layer.

2. The method of claim 1, wherein the non-photosensitive material layer is formed from a material that can be dissolved by the chemical developer used in the first photoresist development.

3. The method of claim 1, wherein the non-photosensitive material layer has a thickness between about 300 Å to 1000 Å.

4. The method of claim 1, wherein the first photoresist layer is a positive photoresist layer.

5. The method of claim 1, wherein the first photoresist layer has a thickness between about 2000 Å to 4000 Å.

6. The method of claim 1, wherein the second photoresist layer is a negative photoresist layer.

7. The method of claim 1, wherein the second photoresist layer has a thickness between about 2000 Å to 4000 Å.

* * * * *